(12) United States Patent
Gao et al.

(10) Patent No.: US 9,520,367 B2
(45) Date of Patent: Dec. 13, 2016

(54) TRENCHED FARADAY SHIELDING

(71) Applicants: Zihao M. Gao, Gilbert, AZ (US);
David C. Burdeaux, Tempe, AZ (US);
Wayne R. Burger, Phoenix, AZ (US);
Robert A. Pryor, Mesa, AZ (US);
Philippe Renaud, Chandler, AZ (US)

(72) Inventors: Zihao M. Gao, Gilbert, AZ (US);
David C. Burdeaux, Tempe, AZ (US);
Wayne R. Burger, Phoenix, AZ (US);
Robert A. Pryor, Mesa, AZ (US);
Philippe Renaud, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/463,982

(22) Filed: Aug. 20, 2014

(65) Prior Publication Data

US 2016/0056114 A1    Feb. 25, 2016

(51) Int. Cl.
*H01L 23/60* (2006.01)
*H01L 29/78* (2006.01)
*H01L 29/66* (2006.01)
*H01L 29/06* (2006.01)
*H01L 21/283* (2006.01)
(Continued)

(52) U.S. Cl.
CPC ............ *H01L 23/60* (2013.01); *H01L 21/283* (2013.01); *H01L 21/30604* (2013.01); *H01L 21/71* (2013.01); *H01L 29/0653* (2013.01); *H01L 29/0696* (2013.01); *H01L 29/0847* (2013.01); *H01L 29/402* (2013.01); *H01L 29/404* (2013.01); *H01L 29/407* (2013.01); *H01L 29/4175* (2013.01); *H01L 29/66659* (2013.01); *H01L 29/66681* (2013.01); *H01L 29/7817* (2013.01); *H01L 29/7823* (2013.01); *H01L 29/7835* (2013.01); *H01L 21/26586* (2013.01); *H01L 29/0634* (2013.01); *H01L 29/1045* (2013.01); *H01L 29/1095* (2013.01); *H01L 2924/0002* (2013.01)

(58) Field of Classification Search
CPC ........................... H01L 21/283; H01L 29/0696
USPC ......................................................... 257/340
See application file for complete search history.

(56) References Cited

U.S. PATENT DOCUMENTS 6,353,252 B1 *  3/2002  Yasuhara .............. H01L 21/763
                                                 257/487
6,445,019 B2 *  9/2002  Van Dalen ............ H01L 29/404
                                                 257/217

(Continued)

OTHER PUBLICATIONS

Freescale Semiconductor, Inc., "50V RF LDMOS: An Ideal RF Power Technology for ISM, Broadcast and Commercial Aerospace Applications", White Paper, Jun. 2011, pp. 1-13.

*Primary Examiner* — Kenneth Parker
*Assistant Examiner* — Warren H Kilpatrick

(57) ABSTRACT

A device includes a semiconductor substrate having a surface with a trench, first and second conduction terminals supported by the semiconductor substrate, a control electrode supported by the semiconductor substrate between the first and second conduction terminals and configured to control flow of charge carriers during operation between the first and second conduction terminals, and a Faraday shield supported by the semiconductor substrate and disposed between the control electrode and the second conduction terminal. At least a portion of the Faraday shield is disposed in the trench.

20 Claims, 4 Drawing Sheets

(51) Int. Cl.
*H01L 21/306* (2006.01)
*H01L 21/71* (2006.01)
*H01L 29/40* (2006.01)
*H01L 29/417* (2006.01)
*H01L 29/08* (2006.01)
*H01L 21/265* (2006.01)
*H01L 29/10* (2006.01)

(56) References Cited

U.S. PATENT DOCUMENTS

| | | |
|---|---|---|
| 7,936,007 B2 | 5/2011 | Marchant et al. |
| 8,314,000 B2 | 11/2012 | Hsieh |
| 8,357,986 B2 * | 1/2013 | Wang et al. ............. 257/492 |
| 9,287,404 B2 * | 3/2016 | Poelzl ............. H01L 29/407 |
| 2012/0187481 A1 | 7/2012 | Mallikarjunaswamy |
| 2012/0286359 A1 | 11/2012 | Lin et al. |
| 2013/0277742 A1 * | 10/2013 | Lee et al. ............. 257/343 |
| 2014/0042522 A1 * | 2/2014 | Li et al. ............. 257/328 |
| 2014/0131796 A1 * | 5/2014 | Zhou et al. ............. 257/336 |
| 2014/0197487 A1 * | 7/2014 | Cascino et al. ............. 257/337 |

* cited by examiner

TRENCHED FARADAY SHIELDING

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in some applications. Some power transistor devices are also designed to handle radio frequency (RF) signals, such as the devices used in wireless communications and other RF power amplifier applications. One type of RF power transistor device is a laterally diffused metal-oxide-semiconductor (LDMOS) transistor. In an LDMOS device, charge carriers drift through a drift space between a channel region and the drain electrode under the electric field arising from an operating voltage applied between the source and drain electrodes.

The high operating voltages between the source and drain electrodes of an LDMOS device may give rise to the presence of high energy charge carriers in the channel region. The high operating voltages lead to high electric fields, which, in turn, increase the energy imparted to the charge carriers within the device. Device degradation typically arises from the injection of the high energy charge carriers, or hot carriers, into the gate oxide, an interlayer dielectric, or field oxide structure of the device. The resulting buildup of charge in the dielectrics from such hot carrier injection (HCI) leads to variations in operational characteristics. For example, the threshold voltage or on-state current may be modified. Performance of the device may thus be adversely affected, especially performance at high frequencies.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
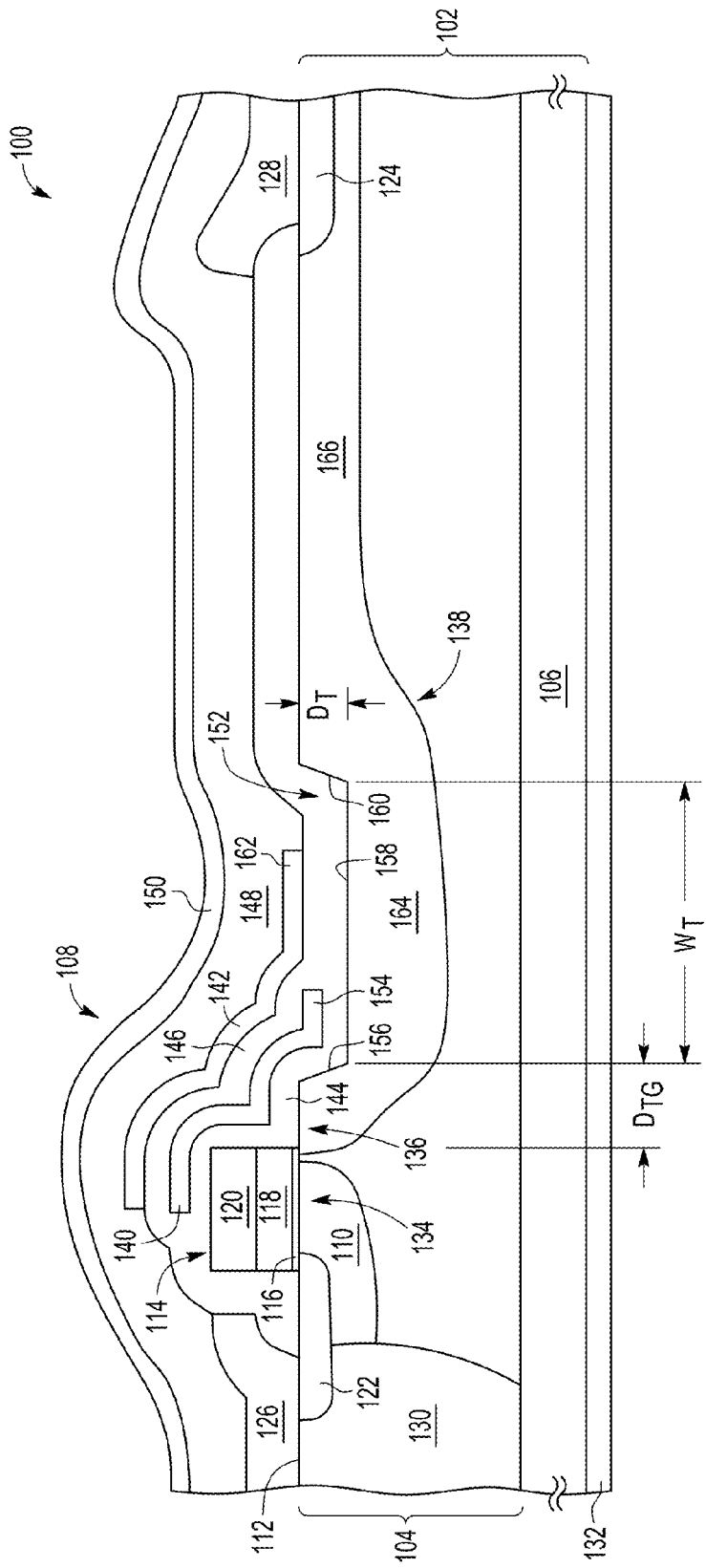
FIG. 1 is a cross-sectional, schematic view of an exemplary LDMOS transistor device having a trenched Faraday shield or plate in accordance with one embodiment.

Embodiments of transistor devices having a trenched Faraday shield are described. Methods of fabricating such devices are also described. At least a portion of the Faraday shield is disposed in a trench formed in a semiconductor substrate on which a control electrode, such as a gate structure, is formed. At least a portion of the Faraday shield is buried or otherwise disposed below the surface of the semiconductor substrate. The buried or trenched nature of the Faraday shield may improve the isolation or shielding of the control electrode structure from a bias voltage applied to a conduction terminal, such as a drain terminal.

The trenched Faraday shield may be realized via a single additional mask in support of an etching procedure. In some cases, an additional dopant implantation procedure is also implemented to avoid or minimize an increase in the on-state resistance of the device. An increased resistance may otherwise be caused by a pinching of a conduction path via a parasitic junction gate field-effect transistor (JFET). The additional dopant implantation procedure may be configured to accentuate a drift region in the proximity of the trench. A section of the drift region along sidewalls of the trench and under the trench may accordingly have higher dopant concentration levels, as described herein.

The trenched Faraday shield may reduce a capacitance (e.g., feedback capacitance) between a biased conduction terminal and the control electrode structure. In some cases, the biased conduction terminal and the control electrode structure are the drain terminal and gate electrode structure of an LDMOS transistor device. In such cases, the trenched Faraday shield may reduce the drain-gate capacitance $C_{dg}$ of the transistor device.

The trenched Faraday shield may reduce drain-gate capacitance $C_{dg}$ by preventing, minimizing, reducing or otherwise shielding fringe coupling between the gate structure and the drain terminal. As a result, the gate structure may avoid exposure to the electric field from the drain terminal. Instead, the gate structure and drain terminal may be effectively decoupled at initial operating voltage levels (e.g., low drain bias) due to the significant modulation of the electric field (e.g., in a drift region of the device).

Reducing the drain-gate capacitance $C_{dg}$ may be useful in RF LDMOS transistor devices to minimize or reduce the impact on RF gain and/or linearity. The trenched Faraday shield may thus provide RF LDMOS transistor devices with improved device performance relative to devices having a shield plate only disposed above the semiconductor substrate, and thus spaced from the surface across the entire lateral extent of the shield plate by one or more dielectric layers.

Through grounding or other low biasing, the trenched Faraday shield may be used to isolate a gate electrode structure from the high voltage at a drain terminal. The electrostatic potential contour lines in the semiconductor substrate are constrained by the boundary condition established by the presence of the trenched Faraday shield plate. With the trenched Faraday shield grounded and positioned near the gate structure, the electrostatic potential near the gate structure may be very low (e.g., near ground). The electric field may thus be substantially reduced near the gate structure.

The lowered electric field within the vicinity of the control electrode structure may also improve device ruggedness. The trenched Faraday shield may improve device ruggedness by effectively relocating hot carriers and impact ionization locations away from the control electrode. Charge carriers near the control electrode are accordingly not experiencing high levels of acceleration. In field-effect embodiments, a gate oxide layer of the control electrode structure may thus be protected from the adverse effects of hot carrier injection (HCI). HCI into the gate oxide layer (and/or any other nearby oxide layer) may thus be substantially reduced.

The improvements in HCI performance and drain-gate capacitance may be achieved without significantly adverse effects on other device parameters. For instance, the trenched Faraday shield may have little or no effect on the breakdown voltage level (e.g., BVdss). In some cases, the breakdown voltage level may, in fact, increase, to the extent that the trench provides a suitable amount of field oxide (or other dielectric) between the gate and the drain. There may also be minimal effect on the on-state resistance, such as the on-state resistance (e.g., Rdson), or resistance at saturation. In some cases, the doping, depth and presence of a drift region near the trench are accentuated through a separate, additional implantation procedure to establish a suitably low resistance level. The implantation procedure may be angled to provide dopant along sidewalls of the trench. Other device parameters may also be unaffected by disposition of the Faraday shield in the trench, including, for instance, the drain-source capacitance and the gate-source capacitance.

Although described below in connection with LDMOS transistor devices, the disclosed devices are not limited to any particular transistor configuration. For instance, the trenched Faraday plate of the disclosed devices may be incorporated into other field-effect transistor devices. One or more features of the disclosed devices may be applied to a variety of different power transistor device configurations. For instance, the trenched Faraday plates may be used with a variety of power transistor structures, including various reduced surface field (RESURF) structures, including single, double, or other RESURF structural arrangements. The disclosed devices may be useful in a wide variety of power electronic apparatus.

For convenience of description and without any intended limitation, n-channel LDMOS devices are described and illustrated herein. Thus, p-type islands or other regions are described for an n-type drift region. However, the disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a schematic cross-sectional view of an example of an n-channel LDMOS device 100 constructed in accordance with one embodiment. The device 100 may be configured for operation as an RF LDMOS transistor device. The device 100 includes a semiconductor substrate 102, which may, in turn, include a number of epitaxial layers 104. In this example, the semiconductor substrate 102 includes a single p-type epitaxial layer 104 grown on an original substrate 106. The original substrate 106 may be a heavily, moderately, or lightly doped p-type substrate in some cases, such as those having multiple epitaxial layers. The device 100 may alternatively or additionally include non-epitaxial layers in which one or more device regions are formed. Any one or more of the layers of the semiconductor substrate 102 may include silicon. The structural, material, and other characteristics of the semiconductor substrate 102 may vary from the example shown. For example, the semiconductor substrate 102 may include a silicon-on-insulator (SOI) construction. Additional, fewer, or alternative layers may be included in the semiconductor substrate 102. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates (e.g., gallium nitride, gallium arsenide, silicon-on-sapphire, and so on).

A device area 108 is depicted in FIG. 1. The device area 108 may be representative of a number of device areas of a discrete device arrangement. For example, the device area 108 may correspond with one finger of a discrete device arrangement having many fingers (e.g., 100s). In other embodiments, the device area 108 may correspond with a portion of an integrated circuit. The device area 108 may include or correspond with one or more active areas of the device 100. In some embodiments, the device area 108 is defined by one or more device isolating regions (not shown) in the semiconductor substrate 102 (e.g., the epitaxial layer 104). The device isolating region(s) may surround the device area 108. These regions act as a barrier separating the device area 108 from other portions of the substrate 102 (or the original substrate 106). For example, the device area 108 may be defined via a moderately or heavily doped n-type isolating well laterally surrounding the device area 108. The isolating well may be ring-shaped. The device area 108 may alternatively or additionally be defined by one or more isolation regions, such as a shallow trench isolation (STI) region.

The device 100 includes a well or diffused region 110 in the semiconductor substrate 102. During operation, a channel or channel region is formed in the well region 110 at a topside surface 112 of the semiconductor substrate 102. The channel region is formed under a gate structure 114 of the device 100 via application of a bias voltage to a conductive portion (e.g., polysilicon layer) of the gate structure 114. The well region 110 may be a region formed by lateral diffusion under the gate structure 104. The well region 110 may be considered a body or base region of the device 100. In this example, the well region 110 is a p-type well formed in the epitaxial layer 104 of the semiconductor substrate 102. The p-type well may be configured for high voltage operation or other operational conditions in typical RF applications. The well region 110 may be configured to establish a desired threshold voltage and/or other operational parameters of the device 100. For example, the dopant concentration level and the depth of the well region 110 may be configured to set the threshold voltage.

The gate structure 114 is formed on or above the semiconductor substrate 102 over the well region 110. The gate structure 114 includes a gate dielectric layer 116 disposed on the surface 112. For example, the gate dielectric layer 116 may include silicon dioxide (or oxide) deposited or otherwise formed on the surface 112. The gate structure 114 may include any number of dielectric layers. The gate dielectric layer 116 spaces a polysilicon or other conductive layer 118 of the gate structure 114 from the well region 110. One or more silicide, metal, or other interconnect layers 120 may, in turn, be disposed on the polysilicon layer 118. The materials, shape, construction, and other characteristics of the gate structure 114 may vary. For example, the lateral extent to which the well region 110 extends under the gate structure 114 may vary from the example shown. The gate structure 114 may include additional components. For example, the gate structure 114 may include one or more dielectric sidewall spacers disposed along lateral edges of the gate structure 114. The sidewall spacers may cover the lateral edges to act as a silicide block to prevent a silicide short along the surface 112. The sidewall spacers may provide spacing to separate the conductive components of the gate structure 114 from other structures or components of the device 100. One or more of the sidewall spacers may alternatively or additionally be used for alignment purposes in defining an edge of one or more regions of the device 100. The edges of one or more other regions may be aligned with the gate structure 114 as described below.

Other aspects of the configuration of the gate structure 114 may vary. For example, the gate structure 114 may include multiple conductive layers (e.g., polysilicon plates). The components, materials, and other characteristics of the gate structure 114 may vary from the example shown. For example, the device 100 may include multiple gate structures. In other devices, other types of control electrodes may be used to control flow of charge carriers during operation between conduction terminals of the device 100.

The device 100 includes heavily doped source and drain regions 122 and 124 in the semiconductor substrate 102. The source and drain regions 122 and 124 are laterally spaced from one another at the surface 112 of the semiconductor substrate 102. The gate structure 114 is supported by the semiconductor substrate 102 between the source and drain regions 122, 124. In this example, the source and drain regions 122 and 124 are asymmetrically arranged about the gate structure 114. The source region 122 may be disposed along or aligned with one sidewall of the gate structure 114. The drain region 124 is spaced from the other sidewall of the gate structure 114 as described below. In some embodiments, the source and drain regions 122 and 124 may have additional or alternative lateral spacing. Any number of source or drain regions 122, 124 may be provided. For example, the drain region 124 may be centered or otherwise disposed between, or laterally surrounded by, two portions of the source region 122 or two separate source regions. For example, the device 100 may be configured as a dual transistor with a shared or common source region or a shared or common drain region. In some cases, the gate structure 114 has a dual gate finger configuration.

In this example, the source and drain regions 122 and 124 are n-type doped portions of the epitaxial layer 104. The heavily doped n-type source region 122 is disposed on, within or adjacent to the well region 110. The heavily doped n-type drain region 124 is spaced from the source 122 and the well 110. Such spacing defines a conduction path of the device between the source and drain regions 122, 124.

The device 100 includes a pair of conduction terminals supported by the semiconductor substrate 102. During operation, the flow of charge carriers between the conduction terminals is controlled by the control electrode, e.g., the gate structure 114 in this case. In this example, the conduction terminals are a source electrode 126 and a drain electrode 128. Each electrode 126, 128 is supported by the semiconductor substrate 102 at the surface 112. The electrodes 126, 128 are directed to biasing or applying voltages to the source region 122 and the drain region 124, respectively. Each electrode 126, 128 is accordingly electrically coupled to the voltages via interconnects (not shown). The regions 22, 124, or a portion thereof, may have a dopant concentration at a level sufficient to establish ohmic contacts with the electrodes 126, 128. During operation, the electrode 128 (and thus the drain region 124) may be biased or otherwise disposed at a relatively high drain-source voltage, Vds, relative to the electrode 126 (and, thus, the source region 122).

The body of the device 100 may be biased via a sinker region 130 adjacent the well region 110. The sinker region 130 extends vertically from the surface 112 through the epitaxial layer 104 to reach the original substrate 106. In this example, the original substrate 106 is highly doped to electrically couple the sinker region 130 to a backside contact 132. In this n-channel example, the backside contact 132 may be used to establish ground potential for the device 100. The manner in which the body of the device 100 is biased may differ in other embodiments. For example, a body contact region may be disposed adjacent the source region 122 to establish an Ohmic contact with an electrode or terminal supported by the topside surface 112 of the semiconductor substrate 102.

When the gate structure 114 is biased, charge carriers (in this case, electrons; alternatively, holes) accumulate in a region at or near the surface 112 under or below the gate structure 114, thereby forming a channel in a channel region 134 that electrically couples the source region 122 and the drain region 124. The channel region 134 is located in the well region 110 at the surface 112 under the gate structure 114. The accumulation of charge carriers (e.g., electrons) results in a majority charge carrier inversion in the channel region 134 from the p-type well region 110 (or epitaxial layer 104) to an n-type conduction layer or area near the surface 112 of the semiconductor substrate 102. Once a sufficient amount of the charge carriers (e.g., electrons) accumulate in the channel region 134, charge carriers (e.g., electrons) are capable of flowing along a conduction path from the source region 122 to the drain region 124. A channel may also be present in a portion of the semiconductor substrate 102 at the surface 112 (e.g., the epitaxial layer 104) adjacent to the well region 110. In other cases, the well region 110 abuts (or is disposed line-on-line with) a drift region described below.

The conduction path is not limited to areas within the well region 110 (or body region) or other regions of the device 100 of the same conductivity type (in this case, p-type). In this example, charge carriers may accumulate in an area at or near the surface 112 in an accumulation region 136 adjacent the well region 110. The accumulation region 136 corresponds with the portion of a drift region 138 that laterally overlaps the gate structure 114. The gate structure 114 may extend over the accumulation region 136 to a varying extent. In this example, the accumulation region 136 and other portions of the drift region 138 are doped n-type. Further details regarding the drift region 138 are provided below.

The conduction path or regions of the device 100 may include still other regions, whether n-type or p-type, at or near the surface 112. For instance, the channel region and/or other conduction region of the device 100 may include one or more lightly or intermediately doped n-type transition regions in the semiconductor substrate 102. For example, the drain region 124 may include or be disposed adjacent to an n-type lightly doped extension region, or NLDD region. An NLDD or other transition region may also be disposed and configured as a transition region between the source region 124 and the channel. The conduction path of the device 100 is thus not limited to regions in which majority charge carrier inversion occurs or to regions in which conduction is enabled or enhanced via the bias voltage applied to the gate structure 114.

The drift region 138 is disposed in the semiconductor substrate 102 between the well region 110 and the drain region 124. The drift region 138 is a doped region having a conductivity type (in this case, n-type) to allow charge carriers (in this case, electrons) to drift through the region under an electric field arising from a bias voltage applied between the source and drain terminals 126, 128 during operation. The drift region 138 may thus electrically couple the drain region 124 to the channel. The drift region 138 extends under a drain-side portion or edge of the gate structure 114. The drift region 138 laterally extends from the drain-side edge of the gate structure 114 to the drain region 124, which may be formed in or otherwise on the drift region 138. The lateral extension of the drift region 138 allows charge carriers (e.g., electrons) in the channel region to reach the drain region 124 during operation. The lateral extent of the drift region 138 may vary. The lateral extent and other characteristics of the drift region 138 may be selected to support high voltage operation of the device 100. For instance, the lateral extent of the drift region 138 may space the gate structure 114 from the high voltage present at the drain region 124. The drift region 138 may also have a dopant concentration lower than the dopant concentration of the source and drain regions 122, 124 to support such high voltage device operation.

The device 100 includes a number of Faraday shields to further support high voltage operation. In this example, the device 100 includes a lower shield 140 and an upper shield 142. In other cases, additional shields may be provided, including, for instance, three, four, or five shields. Each shield 140, 142 is supported by the semiconductor substrate 102 and disposed between the gate structure 114 and the drain terminal 128. Each shield 140, 142 extends laterally over the gate structure 114. In this example, each shield 140, 142 is disposed along or over a portion of the drift region 138 and a drain-side edge or sidewall of the gate structure 114. Each shield 140, 142 may include or be configured as one or more shield or field plates that extend over a portion of the gate structure 114 and/or the drift region 138. In the example of FIG. 1, the plates of the shields 140, 142 overlap the gate structure 114 to an equal extent, but the upper shield 142 extends laterally beyond the lower shield 140 farther toward the drain electrode 128.

The lower and upper shields 140, 142 may help protect the gate dielectric layer 116 from hot carrier injection (HCI) damage or degradation. HCI damage may arise during operation from charge carriers accelerated under the electric field to harmful velocities by the bias voltage applied to the drain electrode 128 (i.e., the drain-source bias voltage). The lower and upper shields 140, 42 may reduce the maximum electric field around the gate structure 114, such as in the accumulation region 136 and other areas in the drift region 138 near the drain-side edge of the gate structure 114. To this end, the lower and upper shields 140, 142 may be grounded or otherwise biased at a lower (e.g., much lower) voltage relative to the voltage at the drain terminal 128. The lower bias of the shields 140, 142 may smoothen the electric field within the vicinity of the shields 140, 142. With the shields positioned near the gate structure 114, the electric field may be smoothened within the vicinity of the gate structure 114 as well. The lower and upper shields 140, 142 may be biased separately (different voltage levels) or collectively (the same voltage level).

At least a portion of one or both of the lower and upper shields 140, 142 is disposed at a height lower than, or below, the gate structure 114 in a trench 152 formed in the surface 112 of the semiconductor substrate 102. Shielding disposed in the trench 152 may provide further HCI protection. The trenched shielding may be useful in additional or alternative ways as described herein. The trench 152 may be formed along the lateral extent of the drift region 138. The trench 152 is spaced from the drain terminal 128 such that the trench and, thus, the trenched portion of the shield(s), are closer to the gate structure 114 than to the drain terminal 128. The proximity of the trenched portion of the shield(s) to the gate structure 114 may help smoothen and/or lower electric field strengths in the vicinity of the gate structure 114.

The trench 152 may be a shallow trench. For example, the trench 152 may be wider in a lateral direction (e.g., the lateral direction shown in FIG. 1 in which the source and drain regions 122, 124 are spaced apart) than the trench 152 is deep. The surface 112 of the semiconductor substrate 102 may be wet or dry etched to form the trench 152. In this example, the epitaxial layer 104 is etched to form the trench 152.

The trenched nature of one or both of the shields 140, 142 may provide additional HCI protection and/or provide HCI protection while improving, or without adversely affecting, other aspects of the operation of the device 100. For example, the drain-gate capacitance may be improved by the trenched shield 140. Examples of improvements in the drain-gate capacitance are described below in connection with FIG. 4. The breakdown voltage level of the device 100 is another device operational parameter that may be improved or at least not significantly adversely affected. Still other parameters that are not significantly adversely affected include other feedback or parasitic capacitances, such as the gate-source capacitance. By avoiding adverse effects on such capacitance parameters, shield plate trenching may be useful in RF applications.

As shown in FIG. 1, a trenched portion 154 of the lower shield 140 is disposed in the trench 152. In this example, the trenched portion 154 constitutes a segment or section of the lower shield 140 disposed entirely below the gate structure 114. The trenched portion 154 thus lies entirely below the level of the surface 112 at the gate structure 114. For example, the trenched portion 154 lies entirely below the level of the surface 112 in the area in which the gate dielectric layer 116 is disposed. In other examples, the trenched segment or section of the lower shield 140 may only lie partially below the level of the surface 112 at the gate structure 114. In such cases, the segment or section of the lower shield 140 may nonetheless be considered to be disposed below the gate structure 114 because the lower shield 140 reaches a depth or level lower than any component of the gate structure 114.

The trenched portion 154 is disposed near a sidewall 156 of the trench 152. The sidewall 156 is located on the gate side of the trench 152. In this embodiment, the trenched portion extends laterally in parallel with a bottom 158 of the trench 152. For example, the trenched portion 154 may extend from near the sidewall 156 along the lateral width of the trench 152 in parallel with the bottom 158 of the trench 152. In this embodiment, the trenched portion 154 does not extend the entire lateral extent of the trench 152. The trenched portion 154 is closer to the gate-side sidewall 156 than a sidewall 160 of the trench 152 disposed on the drain side of the trench 152. The trenched portion 154 corresponds with the segment of the lower shield 140 closest to the drain terminal 128. The positioning, orientation, and other aspects of the trenched portion(s) of the lower shield 140 may vary in other embodiments.

The trench 152 may be filled with one or more dielectric materials in addition to the trenched portion 154. The device 100 includes a number of passivation layers deposited or otherwise formed over the surface 112. In the two-shield example of FIG. 1, the device 100 includes a lower dielectric layer 144, an intermediate dielectric layer 146, and interlayer dielectric (ILD) layers 148, 150. The lower dielectric layer 144 is disposed between the lower shield 140 and the surface 112 and other structures disposed directly or indirectly on the surface 112, such as the gate structure 114. The lower shield 140 may thus be spaced from the sidewalls 156, 160 and the bottom 158 of the trench 152 by the dielectric layer 144. The dielectric layer 146 is disposed between the lower and upper shields 140, 142. The ILD layers 148, 150 are disposed over the upper shield 142, the source and drain conduction terminals 126, 128, and other conductive structures formed in the metal layer of the conduction terminals 126, 128, such as interconnects and/or other contacts.

The thickness, construction, composition, and/or other characteristics of the passivation layers may vary. For example, the lower dielectric layer 144 may include multiple constituent dielectric layers, such as a first, thin oxide layer grown in the trench 154 and other exposed areas of the surface 112 and a second, thicker oxide layer deposited over the thin layer. These constituent oxide layers and other passivation layers are not depicted separately in FIG. 1 if the layers have the same material composition. For example, the lower and intermediate dielectric layers 144, 146 may be contiguous with one another in areas outside of the lower and upper shields 140, 142, and may have the same material composition. In some cases, the layers 144, 146 may both include or consist of silicon dioxide (or oxide). Additional or alternative materials may be used, including, for instance, silicon nitride. In some cases, the ILD layer 148 includes or consists of silicon nitride, and the ILD layer 150 includes or consists of silicon dioxide (or oxide). In some cases, the thickness of the lower dielectric layer 144 falls in a range from about 1.2 microns (μm) to about 1.5 μm.

Additional, alternative, or fewer dielectric layers may be provided over the surface 112 for passivation and/or other purposes. For example, embodiments having only a single shield plate may include at least one fewer dielectric layer for passivation. In other cases, dielectric stacks including multiple dielectric materials may be used to separate the lower and upper shields 140, 142 and/or other conductive structures. Additional dielectric layers may be used in embodiments having more than two shields.

The lower and upper shields 140, 142 may include one or more metal layers. In some cases, tungsten silicide W—Si is used. In other cases, the metal layers may include aluminum or any other metal or conductive material. The metal layer(s) may be deposited. The metal deposition may configure each shield 140, 142 as a plate-shaped structure that conforms to the topography of the device 100 near the gate structure 114. Each shield 140, 142 may thus include a number of segments or sections with corresponding curvature.

In this example, the upper shield 142 includes an end segment 162 that extends laterally beyond the trenched portion 154 toward the drain terminal 128. The end segment 162 may be disposed in parallel with the bottom 158 of the trench 152. In this example, the end segment 162 is not trenched. No portion of the end segment 162 is disposed below the gate structure 114. In other embodiments, the end segment 162 and/or other portions of the upper shield 142 may be trenched as well.

A number of dimensions relating to the trench 152 and/or the trenched portion 154 may be used to optimize one or more operational parameters of the device 100. One configurable dimension is the spacing or distance between the trench 152 and the gate structure 114, or $D_{TG}$, which may fall in a range from about 0.2 μm to about 0.5 μm, although other distances may be used. In one embodiment, the spacing $D_{TG}$ is between about 0.25 μm and about 0.4 μm. As the spacing $D_{TG}$ increases, any adverse effects on the on-state resistance or breakdown voltage level BVdss may be lessened. However, as the spacing $D_{TG}$ increases, the amount of HCI protection provided by the trenched shielding decreases. Other features may be used to address the on-state resistance and breakdown voltage level effects, as described below. The spacing $D_{TG}$ may vary based on a number of factors, including, for instance, the dopant concentration level of the drift region 138. The spacing may be considerably shorter than the distance or spacing between the trench 152 and the drain region 124 (or drain terminal 128). For example, the spacing $D_{TG}$ may be less than or equal to about one-fifth of the trench-drain spacing.

The depth of the trench 152, or $D_T$, may fall in a range from about 0.1 μm to about 0.5 μm, although other depths may be used. The width of the trench 152, or $W_T$, at the opening in the surface 112 may fall in a range from about 0.4 μm to about 0.8 μm, although other widths may be used. Within the trench 152, the trenched portion 154 may have a thickness of about 0.2 μm to about 0.6 μm. The other dimensions of the trenched portion 154 within the trench 152, such as the lateral width shown in FIG. 1, may vary considerably. Within the trench 152, the trenched portion 154 may have a thickness of about 900 Angstroms, although other thicknesses may be used. The trenched portion 154 may be deposited to establish a thickness sufficient to avoid step coverage or other deposition issues as the lower shield 140 steps down into the trench 152.

The above-referenced dimensions of the trench 152 and the trenched portion 154 may vary. Other characteristics of the trench 152 and the trenched portion 154, such as the lateral extent, length, thickness, composition, and vertical inter-shield spacing, may also vary. The number of shields may also vary. For instance, only a single shield may be provided in some cases.

The drift region 138 may be configured as a composite drift region. The drift region 138 may be configured to address possible adverse effects of the presence of the trench 152. The composite drift region 138 may have a number of contiguous, constituent regions in the semiconductor substrate 112. The constituent regions establish or present different dopant concentration levels at a given depth in the semiconductor substrate 102. In the embodiment of FIG. 1, the composite drift region 138 includes a channel-side section 164 and a drain-side section 166. The trench 152 is disposed in the channel-side section 164. The drain-side section 166 is disposed between the channel-side section 164 and the drain terminal 128.

The channel-side section 164 may be configured as an accentuated or enhanced section of the drift region 138. The drain-side section 166 may be configured as a non-accentuated or non-enhanced section of the drift region 138. One section may be enhanced relative to another section as a result of further dopant implantation. The further dopant implantation may result in a higher dopant concentration level and/or a deeper lower boundary. As shown in FIG. 1, the lower boundary of the channel-side section 164 is deeper than the lower boundary of the drain-side section 166. In this example, the channel-side section 164 also has a higher dopant concentration level than the drain-side section 166 at a given substrate depth. For example, the dopant concentration level of the channel-side section 164 may be approximately $3\times10^{16}/cm^3$ at a depth (e.g., about 1.0 μm) at which the drain-side section 166 has a dopant concentration level of approximately $1\times10^{17}/cm^3$. The dopant concentration levels may vary considerably from this example.

The sections 164, 166 of the composite drift region 138 may be formed via multiple dopant implantation procedures. One procedure may be configured to form a well region that extends across the entire lateral extent of the drift region 138. Another procedure may then be used to selectively dope the channel-side section 164. Further procedures may be used to establish or form further sections or alternative dopant concentration profiles.

As described below in connection with FIG. 5, the dopant implantation procedure used to enhance the dopant concentration level in the channel-side section 164 may be configured as an angled implant. The angled implant may be directed to enhancing the dopant concentration level along the sidewall 156 and the bottom 158 of the trench 152. Increasing the dopant concentration level in those areas of the drift region 138 may help offset any adverse effects of the presence of the trench 152 on the on-state resistance. For instance, the increased dopant concentration level may help avoid a pinch-off effect of a parasitic junction gate field effect transistor (JFET) present along the sidewall 156 of the trench 152. Increasing the dopant concentration level and/or depth of the drift region 138 in the area that presents the junction gate of the parasitic JFET may delay or prevent pinch-off of the conduction path.

The configuration of the drift region 138 may vary to provide further reductions in the electric field near the surface 112 and/or the gate structure 114. In other embodiments, the further reductions may be the result of a reduced surface field (RESURF) effect. A number of RESURF regions may be disposed alongside, above, below, or otherwise to the drift region 138 for depletion of the drift region 138 in accordance with the RESURF effect. For example, one or more p-type regions may be disposed adjacent the drift region 138 to further deplete the drift region 138. Alternatively or additionally, a buried n-type layer may be disposed under the device area 108 and configured to extend across some or all of the lateral extent of the drift region 138 to help support a multi-dimensional or double RESURF effect. The positioning, shape, size, and other characteristics of the RESURF region(s) may vary. For example, the RESURF region(s) may be electrically floating or biased at ground or other potential to not be electrically floating.

The device 100 is shown in simplified form in FIG. 1. For example, FIG. 1 does not show a number of metal interconnect layers configured for electric connections with the source terminal 126, the drain terminal 128, and the gate structure 114. The device 100 may have a number of other structures or components for connectivity, isolation, passivation, and other purposes not shown in FIG. 1 for ease in illustration. For instance, the device 100 may include any number of isolating regions or layers. Any number of shallow trench isolation (STI) regions may be formed at the surface 112 of the semiconductor substrate 102. Other STI regions may be disposed in the semiconductor substrate 102 to isolate or separate various contact regions. One or more further STI regions, other isolation trenches, and/or isolation wells (not shown) may be provided to isolate the device area 108 and/or active area of the device 100. In some examples, another p-type epitaxial layer may be disposed between the original substrate 106 and the surface 112 of the semiconductor substrate 102 in the device area 108.

The dopant concentrations, thicknesses, and other characteristics of the above-described semiconductor regions in the semiconductor substrate 102 may vary. In one example of the embodiment shown in FIG. 1, the above-referenced semiconductor regions may have the following approximate concentrations and thicknesses:

|  | Concentration | Thickness |
|---|---|---|
| p-epi 104: | $1\times10^{15}/cm^3$-$2\times10^{15}/cm^3$ | 9 μm-21 μm |
| substrate 106: | $7\times10^{18}/cm^3$-$3\times10^{19}/cm^3$ | not applicable |
| body 110: | $4\times10^{17}/cm^3$-$1\times10^{16}/cm^3$ | 0.4 μm-0.8 μm (gate length) |
| source 122: | $1\times10^{18}/cm^3$-$4\times10^{21}/cm^3$ | 0.2 μm |
| drain 124: | $1\times10^{15}/cm^3$-$4\times10^{21}/cm^3$ | 0.6 μm |
| sinker 130: | $2\times10^{17}/cm^3$-$3\times10^{19}/cm^3$ | 4 μm-8 μm |
| drift 164: | $1\times10^{16}/cm^3$-$3\times10^{17}/cm^3$ | 0.4 μm |
| drift 166: | $1\times10^{16}/cm^3$-$1\times10^{17}/cm^3$ | 0.4 μm |

The concentrations and thicknesses may be different in other embodiments. For example, the dopant concentration of the original substrate 106 may vary considerably. The dopant concentrations and/or depths may have values larger or smaller than the values or ranges provided herein.

In the embodiment of FIG. 1, the trench 152 has a U-shaped cross-sectional profile. The bottom 158 of the trench 152 is flat for approximately the entire width $W_T$ of the trench 152. The profile of the trench 152 may differ in other embodiments, examples of which are described below in connection with FIGS. 2 and 3.

Figure 2:
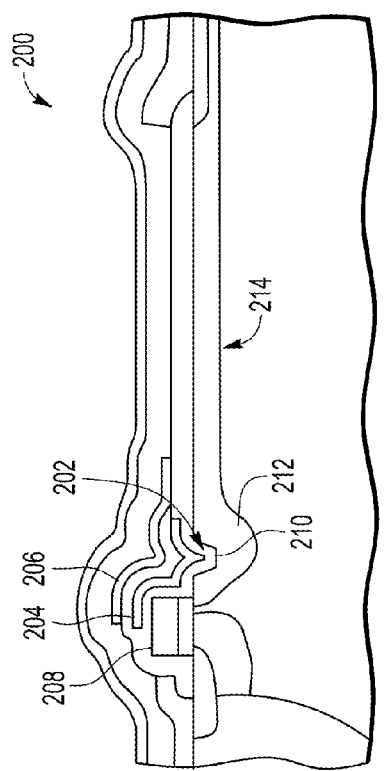
FIG. 2 is a cross-sectional, schematic view of another exemplary LDMOS transistor device having a Faraday shield or plate disposed in a U-shaped trench in accordance with one embodiment.
Figure 3:
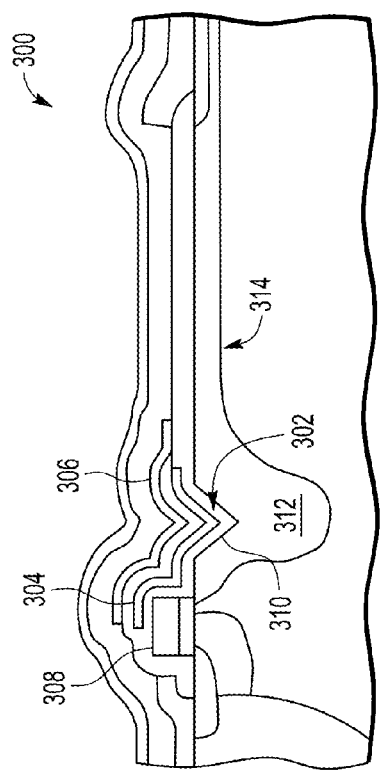
FIG. 3 is a cross-sectional, schematic view of another exemplary LDMOS transistor device having a Faraday shield or plate disposed in a V-shaped trench in accordance with one embodiment.

FIGS. 2 and 3 depict examples in which the configuration of the trench and/or the Faraday shield differs from the examples described above. In addition to trench shape, another difference involves the length of the Faraday shield relative to the trench width. The embodiments differ from the embodiment of FIG. 1, in which the lower shield 140 does not extend across the entire lateral width $W_T$ of the trench 152. In contrast, the upper shield 142 extends over the trench 152 above the lower shield 140 and may, in fact, extend over the entire lateral extent of the trench 152. However, the upper shield 142 does not include a segment, section, or other portion disposed in the trench 152.

FIG. 2 shows another exemplary device 200 with a trench 202 having a U-shaped cross-sectional profile. The device 200 may have a number of components and features in common with the above-described embodiments. For example, the device 200 includes lower and upper shields 204 and 206 that overlap a gate structure 208. As in the previous embodiments, the lower shield 204 includes a trenched portion.

The device 200 differs in the width of trench 202 and the relative length of the lower shield 204. The width of the trench 202 may still be sufficient to have a flat lower boundary 210, but the width is narrowed such that the trenched portion of the lower shield 204 extends across the entire width. In this case, the lower shield 204 extends laterally beyond the trench 202 as shown. The narrower width also leads to a different cross-sectional shape of the trenched portion. In this case, the trenched portion may be considered to have a U-shaped cross-sectional profile, but the profile is closer to a V-shaped cross-section than the embodiment of FIG. 1.

The narrower width of the trench 202 may also lead to a different dopant concentration profile of a channel-side section 212 of a drift region 214. In this case, the channel-side section 212 may thus be narrower as well, with a more pronounced dip in lower boundary depth relative to the depth of the rest of the drift region 214.

FIG. 3 shows an exemplary device 300 with a trench 302 having a V-shaped cross-sectional profile. The device 300 may have a number of components and features in common with the above-described embodiments. For example, the device 300 includes lower and upper shields 304 and 306 that overlap a gate structure 308. As in the previous embodiments, the lower shield 304 includes a trenched portion.

Diagonal or slanted sidewalls 310 of the V-shaped trench 302 meet and accordingly lead to a V-shaped trench portion of the lower shield 304 as shown. The trenched portion follows the topography of the trench 302. The V-shaped profile of the trenched portion is thus maintained, even if the trench 302 is widened (e.g., beyond the width of the example of FIG. 2).

The V-shaped trench 302 may also lead to a deeper channel-side section 312 of a drift region 314. For example, the V-shape of the trench 302 may establish a deeper lowest point of the trench 302 for a given average trench depth (e.g., relative to U-shaped trenches having the same average trench depth). The lower point allows dopant implantation ions to reach deeper substrate depths, thereby forming a deeper, narrower profile for the section 312.

Figure 4:
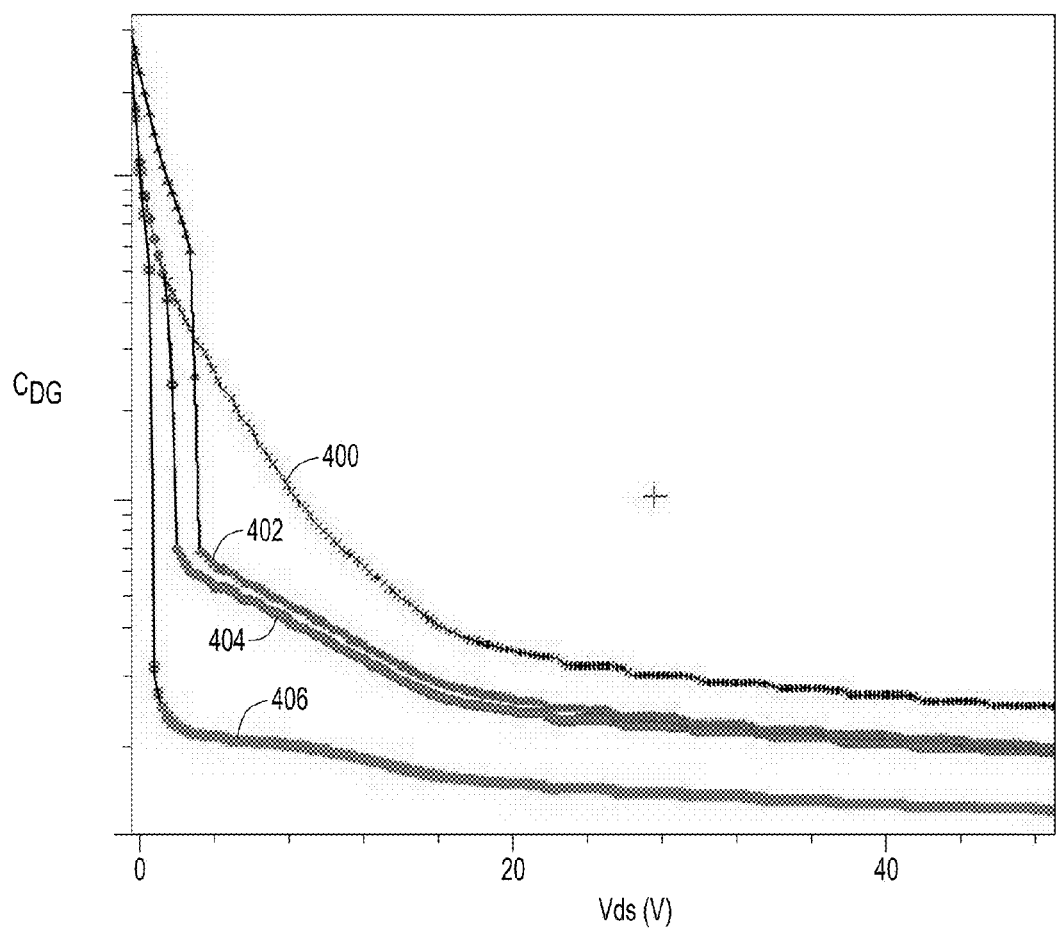
FIG. 4 is a graphical plot of gate-drain capacitance as a function of drain-source voltage in connection with several exemplary LDMOS transistor devices having a trenched Faraday shield or plate.

FIG. 4 is a graphical plot depicting improvements in drain-gate capacitance $C_{dg}$ for several different embodiments of LDMOS transistor devices having a trenched shield plate. The drain-gate capacitance $C_{dg}$ is plotted as a function of the drain-source bias voltage $V_{ds}$. A curve 400 shows the drain-gate capacitance $C_{dg}$ of a baseline LDMOS transistor device with a typical, non-trenched shield plate arrangement. Curves 402, 404, and 406 show the drain-gate capacitance $C_{dg}$ of LDMOS transistor devices having trenched shield plate arrangements. In each case, the drain-gate capacitance $C_{dg}$ exhibits a quick dropoff at low bias voltages. The gate and drain may thus be quickly decoupled during initial drain bias. The decoupling may arise as the potential contour lines are adjusted to meet the new boundary condition defined by the intrusion of a trenched shield plate. Thereafter, the capacitance levels exhibited in the curves 402, 404, and 406 remain lower due to full gate fringe shielding as well as gate-drain decoupling. The curves 402, 404, and 406 also exhibit a relatively flat capacitance level (e.g., relative to the baseline device), which may be useful in providing linearity (e.g., linear efficiency) in RF applications. The trenched shielding may thus be useful at low bias voltages (e.g., for improved intrinsic $C_{dg}$) and at higher bias voltages (e.g., for improved extrinsic $C_{dg}$, which is the portion of the capacitance independent of drain bias). The trenched shielding may improve RF LDMOS linearity by providing a drain-bias independent $C_{dg}$ such that, a constant $C_{dg}$ is provided during large signal load-pull operation with broad drain bias swings. A linear signal response may thus be achieved as shown by the curve 406 in FIG. 4. The LDMOS transistor devices for the curves 402, 404, and 406 may differ in trench width and drift region enhancement.

Figure 5:
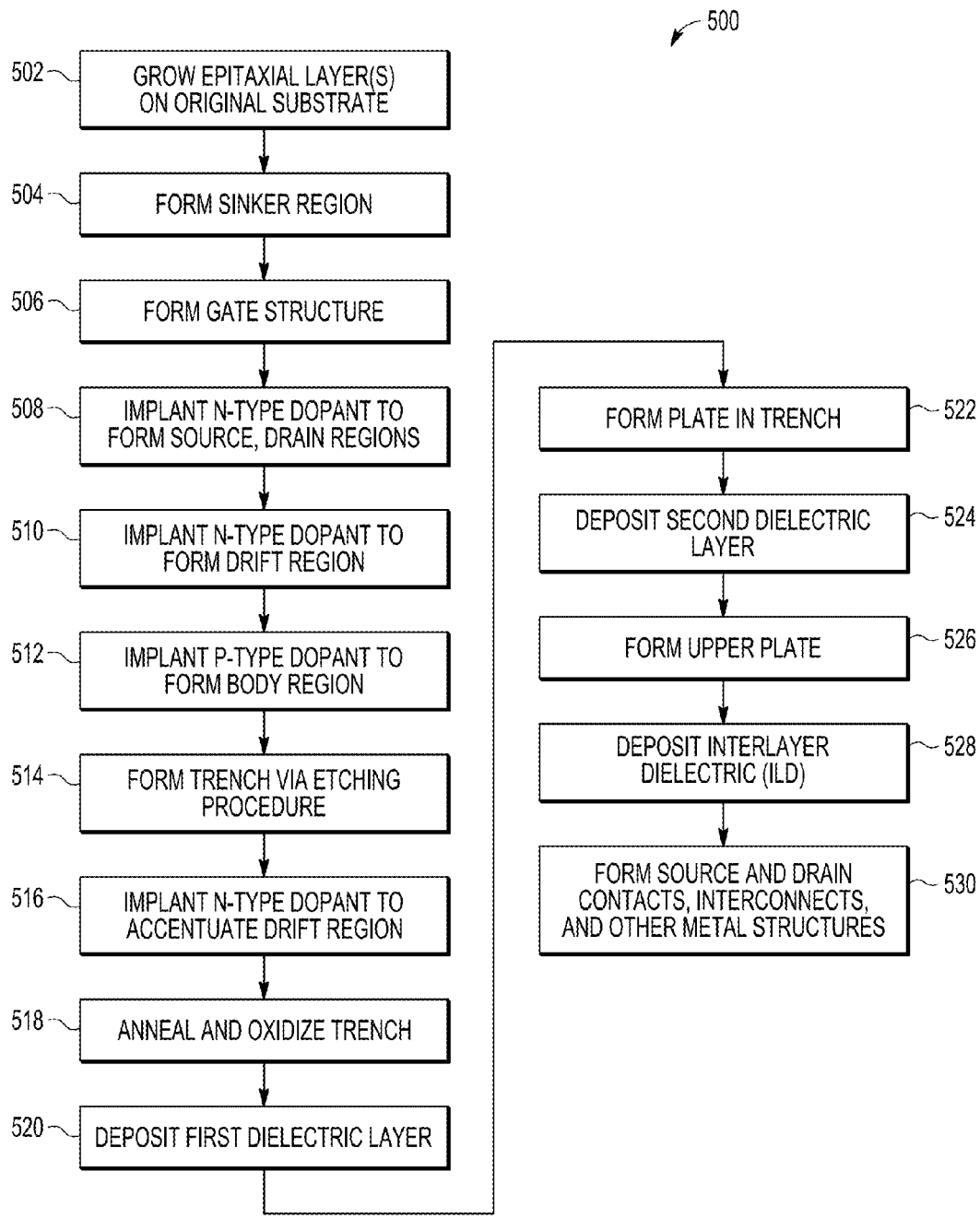
FIG. 5 is a process flow diagram of an exemplary fabrication sequence to construct an LDMOS transistor having a trenched Faraday shield or plate in accordance with one embodiment.

FIG. 5 shows an exemplary fabrication method 500 for fabricating a device with trenched shielding as described above. The transistor device is fabricated with a semiconductor substrate, the regions or layers of which may have the conductivity types of the n-channel examples described above, or be alternatively configured to support a p-channel device. The method 500 includes a sequence of acts or steps, only the salient of which are depicted for convenience in illustration. The ordering of the acts may vary in other embodiments. For example, a drift region doping act 510 may be implemented before or after a source/drain doping act 508. The fabrication method 500 is not limited to any particular doping mechanism, and may include future developed doping techniques.

The method 500 may begin with, or include, act 502 in which a p-type epitaxial layer is grown on a p-type original semiconductor substrate. In some cases, act 502 includes the formation via, e.g., ion implantation, of one or more buried isolating layers (not illustrated) in or below the epitaxial layer. A sinker region is formed in act 504. In some cases, the sinker region may be formed during the growth of the epitaxial layer. Alternatively, the sinker region may be formed via an implant configured to extend through the epitaxial layer to reach the original semiconductor substrate. Any number of epitaxial layers may be grown.

After all of the epitaxial growth is complete, a gate structure (or other control electrode) of the transistor device is formed on a surface of the semiconductor substrate in act 506. The formation of the gate structure may include the deposition or growth of a gate oxide layer and one or more conductive gate layers (e.g., a polysilicon layer and a silicide layer on the polysilicon layer), as well as patterning (e.g., etching) of such layers.

After the gate structure is formed, a number of implantation procedures may be performed. The order in which the procedures are performed may vary. In the example of FIG. 5, a first n-type implant is conducted in act 508 to form source and drain regions (or other conduction terminal regions) at the surface of the semiconductor substrate. The gate structure and/or another photoresist layer may be used as a mask to align the source region with the source-side edge of the gate structure. The source region is thus adjacent to the gate structure, while the drain region is spaced from the gate structure as shown and described herein.

In act 510, the substrate is doped to form a drift region in the semiconductor substrate. As described above, the drift region extends from the gate structure to the drain region to allow charge carriers to drift through the drift region under an electric field arising from a bias voltage applied between the source and drain regions during operation. The doping procedure may include an n-type dopant implantation configured to define an n-type well that extends from the gate structure to the drain region. A drain-side of the gate structure may be used to align the n-type well with the gate structure. The n-type well may define a drain-side section of the drift region and provide some of the doping for a gate-side section of the drift region. In some cases, the drift region is formed before formation of the gate structure.

A photoresist layer and, in some cases, the gate structure are used as a mask in a dopant implant procedure conducted in act 512. The implant is configured to form a well (or body) region in the semiconductor substrate. The act 512 includes a drive procedure to allow the well region to extend a desired lateral distance under the gate structure via lateral diffusion. The drive procedure may be configured to establish the characteristics of a channel region formed during operation. In some cases, the well region is formed before the formation of the gate structure.

In act 514, a trench is etched in the surface of the semiconductor substrate. A plasma etch procedure may be used, but a variety of wet and dry etchants may be used. The etch procedure may be isotropic or anisotropic. A mask may be used to localize the etching. In some cases, the trench is formed via the same procedure used to form shallow trench isolation (STI) regions elsewhere in the substrate. The trench may be spaced from the drain region such that the trench is closer to the gate structure than the drain region. The trench may be otherwise configured as described above.

In some cases, a further dopant implantation procedure is performed in act 516 to accentuate the drift region in the area near the trench. In this case, the further procedure implants n-type dopant (e.g., As). The further procedure is directed to increasing a dopant concentration level of the drift region along sidewalls of the trench and/or under the trench. The implantation procedure may be configured as an angled implantation. For example, the implant may have a tilt angle between about 20 degrees and about 50 degrees. The implant may include a 180 degree rotation to direct the dopant ions at each sidewall. The implantation procedure may also be configured to have an ion energy sufficient to deepen a lower boundary of the drift region under the trench. For example, implant energies may vary based on dopant type, but may be selected to achieve a projection depth between about 50 nanometers (nm) and about 150 nm, but other depths may be used. In some cases, the implant dose may fall in a range from about $1\times10^{12}$ to about $5\times10^{12}$, but other dose amounts may be used.

In act 518, the substrate is annealed to repair the damage arising from the etching procedure and/or the further dopant implantation procedure. The annealing process may also result in the oxidization of the surface of the substrate. For example, the oxidation consumes between about 20 nm and about 50 nm of the substrate (e.g., silicon substrate).

After formation of the trench, a first dielectric layer may be deposited or otherwise provided over the surface in act 520. In some cases, the first dielectric layer comprises a silicon dioxide (or other oxide) layer. The silicon dioxide layer may be grown or deposited. Any number or thickness of dielectric layers may be formed at this point.

In act 522, a Faraday shield is then formed on the surface of the semiconductor substrate. At least a portion of the Faraday shield is disposed below the gate structure in the trench. In this example, formation of the Faraday shield includes deposition of a metal plate, such as a W—Si plate. The Faraday shield may be configured as described above.

In acts 524-530, a number of additional conductive and passivation layers are deposited or otherwise formed. In this example, a second dielectric layer (e.g., silicon dioxide) is deposited in act 524, followed by the formation of another shield plate in act 526. One or more interlayer dielectric layers (e.g., silicon nitride and/or silicon dioxide) may then be deposited in act 528 in connection with the formation of source and drain contacts (or terminals), interconnects, and other metal structures in act 530.

Additional acts may be implemented at various points during the fabrication procedure. For example, the method 500 may include another metal deposition act in which a backside contact is formed. In another example, one or more acts may be directed to defining an active area of the device. In some cases, such acts may include the formation of one or more device isolating wells, layers, or other regions. The procedures may be implemented in various orders. Additional or alternative procedures may be implemented.

In a first aspect, a device includes a semiconductor substrate having a surface with a trench, first and second conduction terminals supported by the semiconductor substrate, a control electrode supported by the semiconductor substrate between the first and second conduction terminals and configured to control flow of charge carriers during operation between the first and second conduction terminals, and a Faraday shield supported by the semiconductor substrate and disposed between the control electrode and the second conduction terminal. At least a portion of the Faraday shield is disposed in the trench.

In a second aspect, an electronic apparatus includes a semiconductor substrate having a surface with a trench and a transistor structure including a transistor body region disposed in the semiconductor substrate. The transistor structure further includes source and drain terminals supported by the semiconductor substrate, a gate structure supported by the semiconductor substrate between the source and drain terminals and configured to control current flow during operation between the source and drain terminals through the transistor body region, and a shield plate disposed between the gate structure and the drain terminal. At least a portion of the shield plate is disposed in the trench at a height lower than the gate structure.

In a third aspect, a method of fabricating a transistor includes forming a control electrode of the transistor on a surface of a semiconductor substrate, implanting dopant in the semiconductor substrate to form first and second conduction terminal regions at the surface of the semiconductor substrate, the first conduction terminal region being adjacent to the control electrode, and the second conduction terminal region being spaced from the control electrode, etching a trench in the surface of the semiconductor substrate, and forming a Faraday shield on the surface of the semiconductor substrate. At least a portion of the Faraday shield is disposed below the control electrode in the trench.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
   a semiconductor substrate having a surface with a trench;
   first and second conduction terminals supported by the semiconductor substrate;
   a control electrode supported by the semiconductor substrate between the first and second conduction terminals and configured to control flow of charge carriers during operation between the first and second conduction terminals; and
   a Faraday shield supported by the semiconductor substrate and disposed between the control electrode and the second conduction terminal;

wherein the trench is laterally spaced from the control electrode by a lateral spacing, wherein the Faraday shield comprises a first portion that extends laterally above the surface of the semiconductor substrate across the lateral spacing and a second portion that extends laterally in the trench, wherein the Faraday shield is plate-shaped such that the second portion has upper and lower surfaces that conform to a topography of the trench, and wherein the Faraday shield is not electrically connected to the control electrode.

2. The device of claim 1, further comprising a doped region in the semiconductor substrate having a conductivity type to allow the charge carriers to drift through the doped region under an electric field arising from a bias voltage applied between the first and second conduction terminals during operation, wherein the trench is disposed in the doped region.

3. The device of claim 2, wherein:
the doped region comprises a first section in which the trench is disposed and a second section disposed between the first section and the second conduction terminal;
a lower boundary of the first section is deeper than a lower boundary of the second section; and
the first section has a higher dopant concentration level than the second section at a given depth.

4. The device of claim 1, wherein the trench has a cross-sectional shape selected from a V-shaped cross-section and a U-shaped cross-section.

5. A device comprising:
a semiconductor substrate having a surface with a trench;
first and second conduction terminals supported by the semiconductor substrate;
a control electrode supported by the semiconductor substrate between the first and second conduction terminals and configured to control flow of charge carriers during operation between the first and second conduction terminals; and
a Faraday shield supported by the semiconductor substrate and disposed between the control electrode and the second conduction terminal;
wherein the trench is laterally spaced from the control electrode by a lateral spacing,
wherein the Faraday shield comprises a first portion that extends laterally above the surface of the semiconductor substrate across the lateral spacing and a second portion that extends laterally in the trench,
wherein the Faraday shield is not electrically connected to the control electrode, and
wherein the second portion of the Faraday shield extends laterally in parallel with a bottom of the trench, and wherein the second portion of the Faraday shield extends less than an entire lateral extent of the trench.

6. The device of claim 1, wherein the portion of the Faraday shield extends an entire lateral extent of the trench.

7. The device of claim 1, further comprising a further Faraday shield extending over the trench above the first-named Faraday shield.

8. The device of claim 1, wherein the Faraday shield extends laterally over the control electrode.

9. A device comprising:
a semiconductor substrate having a surface with a trench;
first and second conduction terminals supported by the semiconductor substrate;
a control electrode supported by the semiconductor substrate between the first and second conduction terminals and configured to control flow of charge carriers during operation between the first and second conduction terminals; and
a Faraday shield supported by the semiconductor substrate and disposed between the control electrode and the second conduction terminal;
wherein the trench is laterally spaced from the control electrode by a lateral spacing,
wherein the Faraday shield comprises a first portion that extends laterally above the surface of the semiconductor substrate across the lateral spacing and a second portion that extends laterally in the trench,
wherein the Faraday shield is not electrically connected to the control electrode, and
wherein the trench is spaced from the second conduction terminal such that the trench is closer to the control electrode than to the second conduction terminal.

10. The device of claim 1, wherein the first and second conduction terminals are asymmetrically arranged about the control electrode.

11. The device of claim 1, wherein the semiconductor substrate comprises an epitaxial layer that establishes the surface with the trench.

12. An electronic apparatus comprising:
a semiconductor substrate having a surface with a trench; and
a transistor structure comprising a transistor body region disposed in the semiconductor substrate, the transistor structure further comprising:
source and drain terminals supported by the semiconductor substrate;
a gate structure supported by the semiconductor substrate between the source and drain terminals and configured to control current flow during operation between the source and drain terminals through the transistor body region; and
a shield plate disposed between the gate structure and the drain terminal;
wherein the trench is laterally spaced from the gate structure by a lateral spacing,
wherein the shield plate comprises a first portion that extends laterally above the surface of the semiconductor substrate across the lateral spacing and a second portion that extends laterally in the trench at a height lower than the gate structure,
wherein the shield plate is plate-shaped such that the second portion has upper and lower surfaces that conform to a topography of the trench, and
wherein the shield plate is not electrically connected to the gate structure.

13. The electronic apparatus of claim 12, further comprising a composite drift region disposed in the semiconductor substrate and having a conductivity type to allow charge carriers to drift through the drift region under an electric field arising from a bias voltage applied between the source and drain terminals during operation, wherein:
the composite drift region comprises a first section in which the trench is disposed and a second section disposed between the first section and the drain terminal; and
a lower boundary of the first section is deeper than a lower boundary of the second section.

14. The electronic apparatus of claim 12, further comprising a composite drift region disposed in the semiconductor substrate and having a conductivity type to allow charge carriers to drift through the drift region under an electric field arising from a bias voltage applied between the source and drain terminals during operation, wherein:

the composite drift region comprises a first section in which the trench is disposed and a second section disposed between the first section and the drain terminal; and the first section has a higher dopant concentration level than the second section at a given depth.

15. The electronic apparatus of claim 12, wherein the trench is spaced from the drain terminal such that the trench is closer to the gate structure than to the drain terminal.

16. A method of fabricating a transistor, the method comprising:

forming a control electrode of the transistor on a surface of a semiconductor substrate;

implanting dopant in the semiconductor substrate to form first and second conduction terminal regions at the surface of the semiconductor substrate, the first conduction terminal region being adjacent to the control electrode, and the second conduction terminal region being spaced from the control electrode;

etching a trench in the surface of the semiconductor substrate, wherein the trench is laterally spaced from the control electrode by a lateral spacing;

forming a Faraday shield on the surface of the semiconductor substrate, wherein the Faraday shield comprises a first portion that extends laterally above the surface of the semiconductor substrate across the lateral spacing and a second portion that extends laterally in the trench at a height lower than the control electrode, and wherein the Faraday shield is plate-shaped such that the second portion has upper and lower surfaces that conform to a topography of the trench; and depositing a dielectric layer between the Faraday shield and the control electrode such that the Faraday shield is not electrically connected to the control electrode.

17. The method of claim 16, further comprising:

performing a first dopant implantation to form a drift region in the semiconductor substrate that extends from the control electrode to the second conduction terminal region to allow charge carriers to drift through the drift region under an electric field arising from a bias voltage applied between the first and second conduction terminal regions during operation; and performing a second dopant implantation to increase a dopant concentration level of the drift region along sidewalls of the trench and under the trench.

18. The method of claim 17, wherein the second dopant implantation is configured as an angled implantation.

19. The method of claim 17, wherein the second dopant implantation has an ion energy sufficient to deepen a lower boundary of the drift region under the trench.

20. A method of fabricating a transistor, the method comprising:

forming a control electrode of the transistor on a surface of a semiconductor substrate;

implanting dopant in the semiconductor substrate to form first and second conduction terminal regions at the surface of the semiconductor substrate, the first conduction terminal region being adjacent to the control electrode, and the second conduction terminal region being spaced from the control electrode;

etching a trench in the surface of the semiconductor substrate, wherein the trench is laterally spaced from the control electrode by a lateral spacing;

forming a Faraday shield on the surface of the semiconductor substrate, wherein the Faraday shield comprises a first portion that extends laterally above the surface of the semiconductor substrate across the lateral spacing and a second portion that extends laterally in the trench at a height lower than the control electrode; and depositing a dielectric layer between the Faraday shield and the control electrode such that the Faraday shield is not electrically connected to the control electrode;

wherein the trench is spaced from the second conduction terminal region such that the trench is closer to the control electrode than to the second conduction terminal region.

* * * * *